United States Patent [19]

Bauer

[11] Patent Number: 4,975,782
[45] Date of Patent: Dec. 4, 1990

[54] FIELD EFFECT CONTROLLED, BIPOLAR POWER SEMICONDUCTOR COMPONENT WITH SILICIDE LAYER

[75] Inventor: Friedhelm Bauer, Wüenlingen, Switzerland

[73] Assignee: Asea Brown Boveri Ltd., Baden, Switzerland

[21] Appl. No.: 313,521

[22] Filed: Feb. 22, 1989

[30] Foreign Application Priority Data

Feb. 22, 1988 [CH] Switzerland .................. 651/88

[51] Int. Cl.$^5$ .................................. H01L 29/74
[52] U.S. Cl. .................................. 357/38; 357/39; 357/34; 357/23.4; 357/67; 357/86; 357/51; 357/59
[58] Field of Search .................. 357/37, 38, 39, 67 S, 357/34, 59 G, 1 I, 86, 23.4, 51

[56] References Cited

U.S. PATENT DOCUMENTS

| | | | |
|---|---|---|---|
| 4,454,527 | 6/1984 | Patalong | 357/86 X |
| 4,466,176 | 8/1984 | Temple | 29/571 |
| 4,580,154 | 4/1986 | Coe | 357/23.4 |
| 4,785,341 | 11/1988 | Ning et al. | 357/67 S X |

FOREIGN PATENT DOCUMENTS

0103934 3/1984 European Pat. Off. .
60-249370 12/1985 Japan .

OTHER PUBLICATIONS

Taur et al., "A Self-Aligned 1-μm-Channel (Mos Technology with Retrograde N-Well and Thin Epitaxy", *IEEE Transactions on Electron Devices*, ED-32 (1985), Feb., No. 2, New York, U.S.A., pp. 203–209.

IEEE Transactions on Electron Devices, vol. ED—33, No. 3, Mar. 1986, Fang—shi J. Lai, et al., pp. 345–353. "Titanium Disilicide Self-Aligned Source/Drain & Gate Technology".

Baliga et al., "Suppressing Latchup in Insulated Gate Transistors", *IEEE Electron Device Letters*, vol. EDL-5, No. 8, Aug. 1984, pp. 323–325.

Russell et al., "The COMFET-A New High Conductance MOS-Gated Device", *IEEE Electron Device Letters*, vol. EDL-4, No. 3, Mar. 1983, pp. 63–65.

Chow et al., "Refractory Metal Silicides: Thin-Film Properties and Processing Technology", *IEEE Transactions on Electron Devices*, vol. ED-30, No. 11, Nov. 1983, pp. 1480–1497.

Hachad et al., "Latchup Criteria in Insulated Gate P-N-P-N Structures", *IEEE Transactions on Electron Devices*, vol. ED-32, No. 3, Mar. 1985, pp. 594–598.

Currie et al., "Contact Metallization Structure Having Controllable Contact Resistance", *IBM Technical Disclosure Bulletin*, vol. 20, No. 12, May 1978, pp. 5178–5179.

International Electron Devices Meeting, 1982, pp. 264–267., IEEE, B. J. Baliga et al., The Insulated Gate Rectifier (IGR): "A New Power Switching Device".

IEEE Electron Device Letters, vol. EDL-5, No. 11, Nov. 1984, pp. 437–439, J. P. Russell et al., "High—Power Conductivity-Modulated FET's (COMFET's) with a P-Type Channel".

Patent Abstracts of Japan, vol. 10, No. 113 (E-399) (2170), Apr. 26, 1986 and JP 60-249370 12/10/85.

"Titanium Disilicide Self-Aigned Source/Drain & Gate Technology", International Electron Devices Meeting, Technical Digest, 13–15, Dec. 1982, San Francisco, Calif., IEEE, C. K. Lau et al., pp. 714–717.

*Primary Examiner*—William Mintel
*Attorney, Agent, or Firm*—Oblon, Spivak, McClelland, Maier & Neustadt

[57] ABSTRACT

In an IGT (Insulated Gate Transistor), the short-circuiting between the n-type regions (5c) and the p-type regions (4b) of the n-type emitter layer or p-type base layer respectively is produced by a buried conducting layer (12), specifically in the form of a metal silicide layer. Regardless of the spacing between cathode contact (8) and gate (7), the length of the n-type regions (5c) can thereby be reduced to such an extent that latching-up of the component is virtually impossible.

5 Claims, 2 Drawing Sheets

FIELD EFFECT CONTROLLED, BIPOLAR POWER SEMICONDUCTOR COMPONENT WITH SILICIDE LAYER BACKGROUND OF THE INVENTION

1. Field of the Invention

The invention relates to the field of power semiconductor components. It relates, in particular, to a field effect controlled bipolar power semiconductor component, comprising a component known, for example, from the article by B. J. Baliga et al., IEEE Int. Electron Dev. Meet. Techn. Dig., pages 264–267 (1982).

The invention furthermore relates to a process for producing such a component, in which process the substrate is first provided with the various layers and is covered with the gate insulation over the entire surface on the cathode side.

2. Discussion of Background

As connecting link between producer and consumer of electrical energy, power electronics requires power switches which can be controlled with simple means.

Hitherto components such as GTOs or power BJTs, whose triggering is, however, very expensive, were available for this purpose. Thus, in the case of the GTO, for example, high gate currents which have to be made available by the triggering circuit are required for turning them off.

The required simplification of the triggering circuit can, in principle, be achieved by components with insulated control electrode such as exist, for example, in the power MOSFET.

The disadvantage of the conventional components with insulated control electrode is, however, the high on-state resistance due to the unipolar current transport.

A new component structure has now been known for some time which combines the advantages of bipolar and MOS power components with each other (see, for example, the publication mentioned in the introduction by B. J. Baliga et al. or the paper by J. P. Russel et al., IEEE Electron Dev. Lett., EDL-4, pages 63–65 (1983)).

The structure of such an IGT (Insulated Gate Transistor) or IGR or COMFET corresponds to that of the modern power MOSFETs except for the drain region: the position of the n-doped drain zone is in this case occupied by a $p^+$-doped p-type emitter layer.

The hole emission from this region is due to, and controlled by, electrons which flow via an MOS inversion channel underneath the insulated gate electrode. The principles of low-powered triggering and of conductivity modulation are combined with each other in this manner.

However, the IGT has an important weakness: its structure comprises a p-n-p-n four-layer sequence so that parasitic thyristor structures are present in the component. As has already been described (S. Nachad et al., IEEE Trans. Electron Dev., ED-32, pages 594–598 (1985)), for this reason the IGT has a tendency to anode-current "latch-up" under certain critical conditions. Control over the current flow by means of the gate is lost in this situation, and the component may be thermally destroyed in a short time.

The problem is therefore to prevent this destructive process by deliberately optimizing the IGT structure to this effect. In this connection, it is found to be an essential criterion in this optimization to minimize the bulk resistance in the p-type regions underneath the n-type regions.

Thus, for example, the paper by B. J. Baliga et al., IEEE Electron Dev. Lett., EDL-5, pages 323–325 (1984) proposes the provision of an additional $p^+$-type zone between the n-type regions of each p-type region in order to reduce the critical bulk resistance.

Although the current level at which the component latches up is increased considerably by this measure, the risk of latch-up is nevertheless not completely averted.

SUMMARY OF THE INVENTION

Accordingly, one object of this invention is to modify the structure of an IGT so that the latch-up current level is increased, with or without additional $p^+$-type zone, to such an extent that the component is substantially immune to the latch-up.

The object is achieved in a component of the type mentioned in the introduction, wherein the conductive connection between each cathode contact and the associated n-type regions is produced by means of a conducting layer which extends on the surface of the substrate between the cathode contact and the associated n-type regions.

A starting point of the invention is also to minimize the bulk resistance beneath the n-type regions. In this connection, the aim is to reduce the bulk resistance by shortening the n-type regions. The smallest achievable extension of the n-type regions is dictated by the technology used.

The length ($\times 3$ in FIG. 2) of the n-type regions must be sufficiently large, on the one hand, to be able to reliably short-circuit the n-type regions and the p-type regions. On the other hand, because of the alignment inaccuracy, a minimum spacing must continue to be preserved between the contact hole for the cathode contact and the gate electrode.

For the hitherto known IGT structure, in which the n-type regions extend far below the cathode contact, the smallest achievable length is appreciably more than 2 micrometers.

The essence of the invention is therefore no longer to ensure the short-circuiting of the n-type region by a large overlapping with the cathode contact, but to provide, on the surface of the substrate, a special conducting layer which produces said short-circuiting. In this manner, the length of the n-type regions can be considerably reduced, regardless of the minimum spacing previously mentioned.

According to a first preferred exemplary embodiment, said conducting layer is composed of a metal silicide, the metal being selected from the series comprising titanium, tungsten, tantalum and cobalt. With such metal silicide conducting layers, a good contact, a high stability and a good resolution in the structuring, accompanied by a relatively high conductivity, are achieved.

According to a further preferred exemplary embodiment, the gate electrodes are composed of polysilicon and are provided with a similar metal silicide conducting layer on their upper side. This makes it possible to reduce the resistance of the gate system by almost an order of magnitude compared with the previous pure polysilicon layers, which produces a lasting improvement in the dynamic characteristics of the component.

The process according to the invention is characterized by the following steps, which comprise removing the gate insulation except for the regions underneath the gate electrodes and the peripheral regions around the gate electrodes;

depositing the conducting layer on the exposed surface of the substrate;

covering the n-type regions and the gate electrodes with the gate insulation again; and then depositing the cathode contacts.

According to a preferred exemplary embodiment for the process according to the invention, polysilicon gate electrodes are used, which are also provided with a conducting layer, and to deposit the conducting layers, a metal from the series comprising titanium, tungsten, tantalum and cobalt is first deposited over the entire surface and the corresponding metal silicide is then formed in an annealing process.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
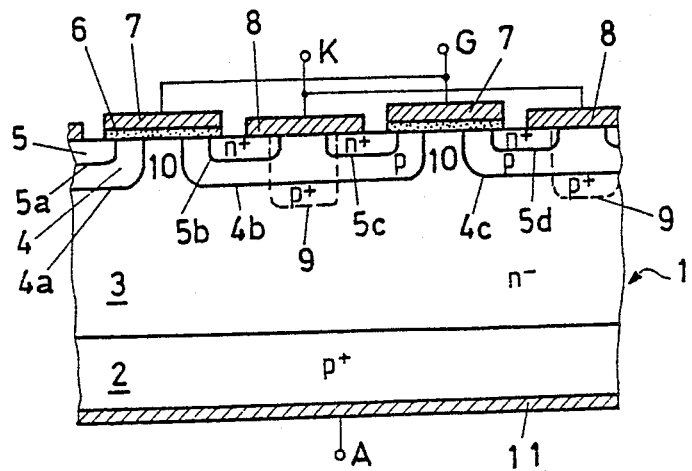
FIG. 1 shows the cross-section through an IGT structure (as a cut-away portion) according to the prior art.

Referring now to the drawings, wherein like reference numerals designate identical or corresponding parts throughout the several views, FIG. 1 shows, as a cut-away portion, the structure of an IGT according to the prior art as it is known from the papers by B. J. Baliga et al. or J. P. Russel et al. mentioned in the introduction.

In this conventional structure, variously doped layers and regions are disposed in a layer sequence in a substrate 1 between an anode A and a cathode K.

The layer sequence comprises a p+-doped p-type emitter layer 2, an n−-doped n-type base layer 3, a p-doped p-type base layer 4 and an n+-doped n-type emitter layer 5.

The p-type base layer 4 is subdivided into individual p-type regions 4a, .., c which are separated from each other by gaps 10. In these gaps 10, the n-type base layer 3 situated thereunder emerges at the cathode-side surface of the substrate 1.

The n-type emitter layer 5 is embedded in the form of individual n-type regions 5a, .., e in each of the p-type regions 4a, .., c. At the same time, the p-type base layer 4 also emerges at the cathode-side surface of the substrate 1 at the sides of the p-type regions 4a, .., c and between the adjacent n-type regions.

The cathode-side gate-cathode structure comprises alternatingly disposed gate electrodes 7 and cathode contacts 8. Disposed above each of the p-type regions 4a,...,c, there is in each case a cathode contact 8 which makes direct contact to all the n-type regions of the respective p-type region and also to the p-type region emerging at the surface between said n-type regions.

Deposited on the substrate surface above each gap 10, there is in turn a gate electrode 7 which is separated electrically from the substrate 1 by a suitable gate insulation 6, for example of $SiO_2$. At the same time, the gate electrode 7 covers not only the corresponding gap 10, but also the areas of the adjacent p-type regions in which the p-type base layer 4 emerges at the substrate surface.

The gate electrodes 7 are connected to the gate G of the component. Deposited on the p-type emitter layer 2 on the anode side is an anode contact 11 over the entire surface, which is connected to the anode A.

A p+-type zone 9, which extends through the p-type base layer 4 into the n-type base layer 3 and which serves to reduce the tendency of the component to "latchup", may further be provided in addition between the n-type regions of each p-type region.

It is not necessary to go into the mode of operation of the IGT here in more detail since this has already been described comprehensively in the publications cited.

Figure 2:
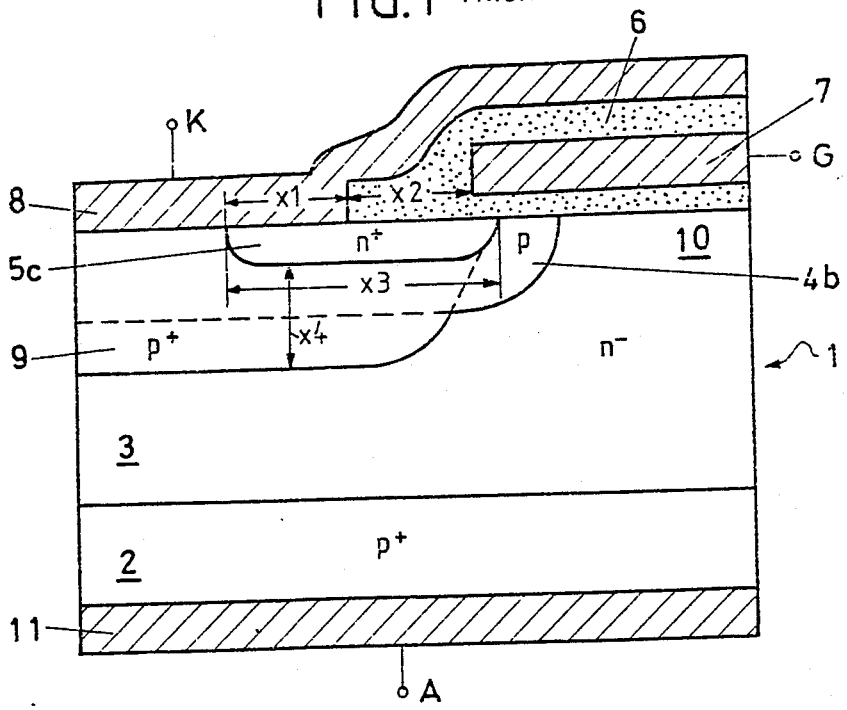
FIG. 2 shows an enlarged partial region of a structure comparable with FIG. 1.

The disadvantages of the known IGT structure can be made clear by referring to the cut-away portion, shown in FIG. 2, of an individual cell of the IGT: as already mentioned in the introduction, the bulk resistance in the p-type region (4b) beneath the n-type region (5c) is essentially responsible for the latching-up of the parasitic thyristor structure in the IGT, and the smaller this bulk resistance, the lower also is the tendency of the component to latch up.

The bulk resistance may be reduced either by reducing the specific resistance in the channel region (for example, by means of the p+-type zone 9) or by shortening the channel.

The aim of the present invention is therefore to shorten the length of the channel. The channel length is at the same time essentially determined by the length $\times 3$ of the n-type region 5c.

The length $\times 3$ of the n-type region is determined in turn by the technology used; in an IGT according to the prior art, $\times 3$ has to be sufficiently large to be able to reliably short-circuit the n-type region and the p-type base layer. This necessitates an overlapping of the n-type region with the cathode contact over the length $\times 1$ (FIG. 2).

On the other hand, because of unavoidable alignment inaccuracies, also a minimum spacing (length $\times 2$ in FIG. 2) must continue to be preserved between the contact hole of the cathode contact 8 and the adjacent gate electrode 7. A length $\times 2$ of appreciably more than 2 micrometers which it is not possible to go below emerges from these preconditions in the case of the known IGTs.

While the length $\times 2$ cannot be reduced without fairly large expenditure, the length $\times 3$ can be drastically reduced if, according to the invention, the relationship between the lengths $\times 1$ and $\times 3$ is eliminated, i.e. if the n-type regions are short-circuited without overlapping.

The necessary electrical connection between the n-type region 5c and the associated cathode contact 8 is in this case produced by a special conducting layer 12 (FIG. 3D) which extends on the substrate surface from the n-type region 5c to the cathode contact 8.

Preferably, said conducting layer 12 is composed of a thin metal silicide layer, a metal from the series comprising titanium, tungsten, tantalum and cobalt being used.

Such a metal silicide contacting system has already proved successful in very large-scale integration (see, for example, F. -S. J. Lai et al., IEEE Trans. Electron Dev., ED-33, pages 345–353 (1986)), is compatible with semiconductor technology and is notable for a high stability.

The short-circuiting of the n-type region 5c with the p-type region 4b is brought about in this manner by the conducting layer 12 buried under the cathode contact 8 and the gate insulation 6. This makes it possible to design the length ×3 as short as technologically possible and consequently to dispense at least with the length ×1 associated with the overlapping. The n-type regions are then completely covered by the gate insulation 6.

Further advantages emerge, with a polysilicon gate electrode 7, when a second similar conducting layer 13 (FIG. 3D) is additionally deposited on the electrode surface. This makes it possible to reduce the comparatively high gate resistance considerably and consequently to improve the dynamic behavior of the component considerably.

In addition, both conducting layers 12 and 13 can readily be produced in a single process.

Various steps of a preferred embodiment of the process according to the invention are shown in FIGS. 3A-D.

Figure 3A:
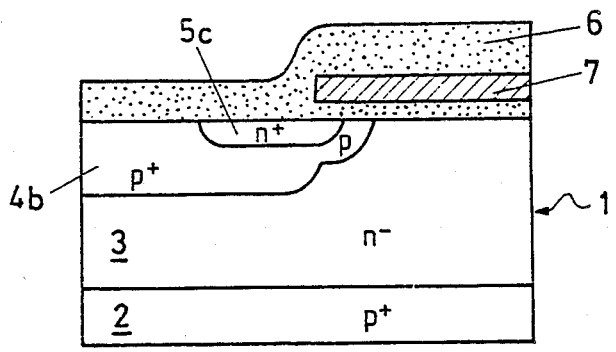
FIGS. 3A–D show various steps in the production of an IGT according to an exemplary embodiment of the invention.

In this process, the starting point is a stage in which the doping is already present inside the substrate 1, the gate electrodes 7 (of polysilicon) are suitably structured and a gate insulation 6 ($SiO_2$ deposited from the gas phase by the LPCVD process) covers the entire surface (FIG. 3A).

Figure 3B:
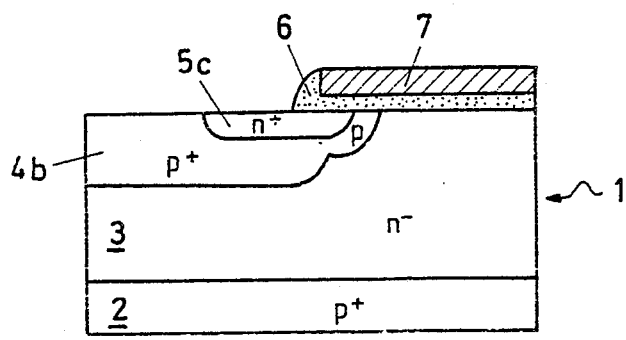

As a departure from the prior art, the gate insulation 6 is now anisotropically etched over the entire surface; in this connection, for example, the reactive ion etches (RIE) are suitable. Owing to the lack of uniformity of thickness at the edge of the gate electrode 7, a peripheral region of the gate insulation remains intact at that point; the gate insulation beneath the gate electrodes 7 also remains intact (FIG. 3B).

A metal which forms a metal silicide resistant to high temperatures with siliton (see also T. P. Chow et al., IEEE Trans. Electron Dev., ED-30, pages 1480–1497 (1983)) is now evaporated or deposited on the structure over the entire surface. Suitable metals are, for example, titanium, tungsten, tantalum and cobalt.

Figure 3C:
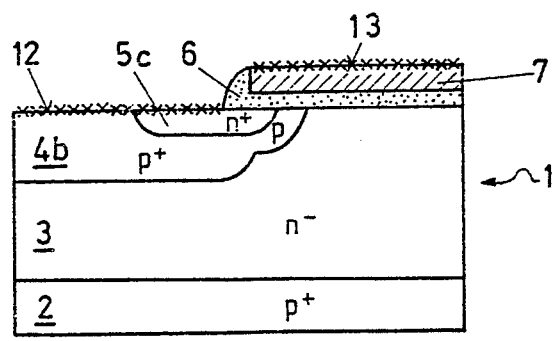

After the evaporation or deposition of the metal, the formation of the silicide requires an annealing process. The temperature can in this case be chosen so that the silicide formation takes place on the substrate and the polysilcon gate electrode, but not on the peripheral regions of the $SiO_2$ gate insulation at the edge of the gate electrode. The unreacted metal left there may then be removed in a wet-chemical etching process. The structure shown in FIG. 3C is consequently present, the conducting layers 12, 13 being indicated by crosses.

To achieve the highest possible conductivity of the silicide layer, a further annealing process, this time at higher temperatures, is advisable.

Figure 3D:
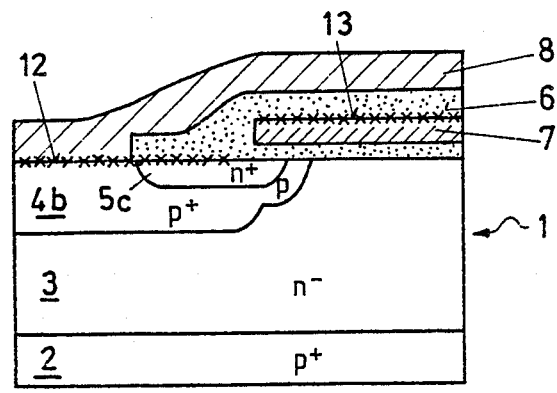

The structure can then be further treated in the usual manner: after the deposition of an insulating $SiO_2$ layer, a contact hole is opened through said layer, and finally, the cathode metallization (cathode contact 8) is deposited (FIG. 3D).

In total, the invention achieves improvements which become apparent on comparing FIG. 2 and 3D:
The short-circuiting of the n-type regions with the p-type emitter layer is brought about by the buried, highly conductive conducting layer 12. This makes it possible to choose the length ×3 of the n-type regions as small as technologically possible and consequently to achieve a high immunity to latching-up.
Owing to the high conductivity of the conducting layer 12, it is possible to dispense with relatively deep n-type regions. As a result, the vertical extension of the p-type emitter layer 4 beneath the n-type regions (length ×4 in FIG. 2) can be increased. This also benefits the reduction of the bulk resistance.

Together with the n-type region, a polysilicon gate electrode, which does not usually have a particularly high conductivity, can also be given a conducting layer 13. In this way, the resistance of the gate can be reduced by nearly an order of magnitude. This produces a lasting improvement in the dynamic characteristics of the component.

The invention can be applied both to IGTs without $p^+$-type zone and also to IGTs with $p^+$-type zone.

Finally, it should further be expressly pointed out that the invention relates not only to components with the specified layer sequence, but in exactly the same way it can be applied to components with a complementary layer sequence such as, for example, are known from the paper by J. P. Russel et al., IEEE Electron Dev. Lett., EDL-5, pages 437–439 (1984).

In this case, the p-type emitter layer, the n-type base layer, the p-type base layer, the n-type emitter layer, the p-type regions and the n-type regions are replaced by a corresponding n-type emitter layer, p-type base layer, n-type base layer, p-type emitter layer, n-type regions and p-type regions.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by letters patent of the United States is:

1. A field effect controlled, bipolar semiconductor device, comprising
    (a) a disk-like semiconductor substrate having first and second parallel main surfaces, wherein the first of said main surfaces is connected to an anode (A), and the second of said main surfaces is connected to a cathode (K);
    (b) two successive layers provided within said semiconductor substrate extending in parallel with said main surfaces, wherein a first of said successive layers comprises a p-type emitter layer which abuts upon said first main surface, and the second of said successive layers comprises an n-type base layer which abuts upon said second main surface;
    (c) a plurality of individual p-type regions constituting a p-type base layer and being embedded side by side in said n-type base layer at said second main surface, and being separated from each other by gaps, wherein said n-type base layer emerges in said gaps at said second main surface of said semiconductor substrate;
    (d) a plurality of individual n-type regions being embedded in each of said p-type regions in a manner such that each said p-type region emerges at said second main surface of said semiconductor substrate at outer sides of said p-type region and between the n-type regions embedded therein; and
    (e) a gate-cathode structure with alternatingly disposed gate electrodes and cathode contacts provided on said second main surface, wherein one of said cathode contacts is disposed above each of said p-type regions and conductively connected to all n-type regions of the associated p-type region, and makes contact to said p-type region between said n-type regions, and wherein above each of said gaps between adjacent of said p-type regions is disposed one of said gate electrodes and which is electrically insulated from said semiconductor substrate and which covers those parts of said adjacent p-type regions which emerge at said second main surface; and (f) a first conductive layer provided for conductive connection between each of said cathode contacts and the associated n-type regions, said first conductive layer extending on said second main surface of said semiconductor substrate from between respective ones of said cathode contacts and said associated p-type region to all n-type regions of said p-type region, said first conductive layer covering said n-type regions partially and being composed of a metal silicide.

2. The device as claimed in claim 1, wherein said first conductive layer has a composition and comprises a metal selected from the group consisting of titanium, tungsten, tantalum and cobalt.

3. The device as claimed in claim 2, wherein said first conductive layer is isolated from said cathode contact where said first conductive layer covers said n-type regions.

4. The device as claimed in claim 3, wherein said gate electrodes are composed of polysilicon and are provided with a second conductive layer on each of their upper sides, said second conductive layer having a composition similar to the composition of said first conductive layer.

5. The device as claimed in claim 1, comprising:

a $p^+$-type zone disposed in each case between the n-type regions embedded in each of said p-type regions, said $p^{30}$-type zone extending from said second main surface of said semiconductor substrate through said p-type region into said n-type base layer.

* * * * *